United States Patent [19]

Yoder et al.

[11] Patent Number: 4,710,478

[45] Date of Patent: Dec. 1, 1987

[54] METHOD FOR MAKING GERMANIUM/GALLIUM ARSENIDE HIGH MOBILITY COMPLEMENTARY LOGIC TRANSISTORS

[75] Inventors: Max N. Yoder, Falls Church; George B. Wright, McLean, both of Va.

[73] Assignee: United States of America as represented by the Secretary of the Navy, Washington, D.C.

[21] Appl. No.: 736,051

[22] Filed: May 20, 1985

[51] Int. Cl.⁴ .......................................... H01L 21/203
[52] U.S. Cl. ........................................ 437/40; 437/22; 437/24; 437/57; 437/107; 437/133; 437/132; 357/16; 357/22; 357/42
[58] Field of Search .................. 29/571, 576 B, 576 E; 148/15, 185, 187, DIG. 56, DIG. 58, DIG. 59; 357/42, 44, 16, 22; 437/132, 133, 22, 24, 57, 107

[56] References Cited

U.S. PATENT DOCUMENTS

| | | | |
|---|---|---|---|
| 3,532,562 | 10/1970 | Clawson et al. | 148/179 |
| 3,866,310 | 2/1975 | Mover et al. | 29/571 |
| 3,925,120 | 12/1975 | Saida et al. | 148/175 |
| 3,936,857 | 2/1976 | Ota | 357/23 |
| 4,012,235 | 3/1977 | Mayer et al. | 148/1.5 |
| 4,226,649 | 10/1980 | Davey et al. | 148/175 |
| 4,380,774 | 4/1983 | Yoder | 357/34 |
| 4,385,198 | 5/1983 | Rawilly | 136/249 |
| 4,385,938 | 5/1983 | Park et al. | 148/1.5 |
| 4,389,768 | 6/1983 | Fowler et al. | 29/571 |
| 4,394,180 | 7/1983 | Dearnaley et al. | 148/1.5 |
| 4,400,221 | 8/1983 | Rawilly | 148/1.5 |
| 4,404,732 | 9/1983 | Andvade | 29/571 |
| 4,409,726 | 10/1983 | Shiofa | 29/571 |
| 4,482,906 | 11/1984 | Hovel et al. | 357/16 |
| 4,507,845 | 4/1985 | McIver et al. | 29/571 |
| 4,509,990 | 4/1985 | Vasuder | 148/1.5 |
| 4,540,496 | 9/1985 | Nonaka et al. | 148/1.5 |
| 4,545,109 | 10/1985 | Reichert | 29/571 |
| 4,556,895 | 12/1985 | Dhata | 357/23.7 |
| 4,558,509 | 12/1985 | Tiwari | 29/576 B |
| 4,561,916 | 12/1985 | Skiyama et al. | 148/175 |
| 4,583,105 | 4/1986 | Rosenberg | 357/23.12 |
| 4,593,301 | 6/1986 | Inata et al. | 357/22 |
| 4,600,932 | 7/1986 | Norris | 357/22 |

OTHER PUBLICATIONS

Sze. S. M. Physics of Semiconductor Services, John Wiley & Sons, 1982, pp. 347–351.
Burmeister et al., "Epitaxial Growth of $GaAs_{1-x}Px$ on Ge snst" Transactions of the Mettallurgical Society of AIMF, vol. 245, Mar. 1969, 565–569.
Dunike et al., "GaAs FETS", IBM TDB, vol. 14, No. 4, Sept. 1971, pp. 1248–1249.
Pruhiaux et al., "Semi-Insulated Gate GaAs fet", IEEE transactions on Electron Services, vol. Ed-19, No. 5, May 1972, pp. 672–674.
Chu et al., "GaAs films on recrystallized Ge perns", J. of Appl. Physica, vol. No. 11, Nov. 1977, pp. 4848–4849.
Williams, J. S. et al., ECS Extended Abstracts, L. A. Meeting, Oct. 14–19, 1979, pp. 914–915.
Csepregi, L., et al., Solid State Communications, vol. 21, 1977. Pergamon Press, pp. 1019–1021.
Takagi, T. et al., Thin Solid Films, vol. 39, 1976, pp. 207–217.
Takgi, T., Materials Research Society Symposium Proceedings, vol. 27, 1984, Elgevier Sci. Publ., pp. 501–511.
Younger, P. R., J. Vac. Sci. Technol. A3 (3), May/Jun. 1985, pp. 588–589.
Paude, K. P., et al., J. Electrochem. Soc., Solid-State Science and Technology, vol. 13, No. 6, Jun. 1984, pp. 1357–1359.
Richard, P. D. et al., J. Vac. Sci. Technol. A3 (3), May/Jun. 1985, pp. 867–872.

Primary Examiner—Brian E. Hearn
Assistant Examiner—T. N. Quach
Attorney, Agent, or Firm—Kenneth E. Walden; Frederick A. Wein

[57] ABSTRACT

The present invention relates to complementary logic field effect transistors having high electron and hole mobility and above to maintain transistor action at cryogenic temperatures. In one embodiment germanium material is deposited upon a gallium arsenide substrate and high hole concentration areas and high electron concentration areas are created in the germanium layer. In another embodiment a germanium substrate is provided and a gallium arsenide layer is grown upon the germanium substrate with appropriate high hole concentration areas and high electron concentration areas being created within the gallium arsenide.

6 Claims, 4 Drawing Figures

METHOD FOR MAKING GERMANIUM/GALLIUM ARSENIDE HIGH MOBILITY COMPLEMENTARY LOGIC TRANSISTORS

BACKGROUND OF THE INVENTION

The present invention relates to complementary logic field effect transistors, and more particularly to such transistors made from germanium and gallium arsenide.

Complementary pair (p-channel, n-channel) metal-oxide-silicon (CMOS) field effect transistors were developed in the late 1960's and represent a large fraction of the total semiconductor market today. Their basic attribute is that logic cells and memory cells fabricated in CMOS technology consume negligible power except during the switching process. Their greatest drawback is that they are comparatively slow. The slow speed accrues from the relatively low mobility of charge carriers in silicon. To operate at subnanosecond speeds requires that they be fabricated with exceedingly small dimensions to minimize the transit time of charge carriers across the channel. A further disadvantage of CMOS technology derives from the disparity between hole mobility and electron mobility in silicon. This generally requires the p-channel device to be about four times larger than the n-channel device. Thus, additional speed can be obtained in CMOS logic devices only by the expensive yield-reducing process of shrinking size to submicrometer dimensions.

Recently a high speed, moderate-power logic technology has been developed based on a technology given various names to describe the principle employed. Among these names are high electron mobility transistor (HEMT), two dimensional electron gas (2 DEG) transistor, selectively-doped heterojunction transistor (SDHT), modulation-doped transistor (MODFET), and others. Their principle of operation depends on a heterojunction wherein a high bandgap semiconductor layer, e.g., GaAlAs, is grown over an unintentionally-doped lower bandgap material, e.g., GaAs. Ionized impurities purposefully placed in the higher bandgap semiconductor overlayer lose their electrons to the upper region of the lower bandgap material thereby forming a pseudo two dimensional electron gas (2 DEG). Since the region of the 2 DEG contains only residual background impurities in concentrations of but $5 \times 10^{14}$ parts per cubic centimeter, there exists comparatively little impurity scattering thereby providing a much higher electron mobility than would otherwise exist for a given concentration of electrons in conventional structures. These devices have exhibited switching speeds as fast as 12 picoseconds and represent the very fastest of semiconductor logic technology today.

The biggest limitation of these devices is that their complement, a high hole mobility transistor, does not exist. Complementary logic is therefore not feasible at the present time. Attempts to circumvent this limitation are to use a combination of normally-ON and normally-OFF devices on the same chip. This requires rather extreme dimensional control and practical yields remain to be seen and even when achieved, power dissipation exceeds that which would result from a true complementary high mobility transistor logic device. Thus, HEMT technology has speed advantages, but consumes much more power than does CMOS technology.

Further, with regard to these devices, the GaAs/GaAlAs heterojunction interface has made possible the High Electron Mobility Transistor (HEMT). This device has exhibited record-breaking millimeter wave noise figures, fastest semiconductor logic speeds, and lowest power semiconductor logic. Even with this performance, it has not entirely lived up to expectations. The reasons for the shortcomings are primarily threefold. Firstly, it has only recently been shown that the effective heterojunction energy discontinuity in the GaAs/GaAlAs interface is much lower than originally thought. This is because the donors in the GaAlAs go deep at large mole fractions of aluminum, and in fact they go so deep that the energy level of the donors is only 100 mev above that of the GaAs material into which they transfer. Thus the large effects originally expected do not accrue. Secondly, the electrons, once they have transferred to the two dimensional electron gas in the underlying GaAs, are scattered by polar phonon scattering. The final third limitation is that the complementary two dimensional HOLE gas in GaAs suffers from a heavy mass and has such a low saturated velocity that it is impractical.

The GaAs/GaInAs heterojunction overcomes the first problem of the GaAlAs/GaAs interface in that the full heterojunction energy can be realized. It does, however, create another problem, that of alloy scattering. Even though the effective electron mass in GaInAs is even lighter than in GaAs and a greater heterojunction discontinuity can be realized, the alloy scattering problem of electrons in GaInAs seriously limits performance to the extent that little is gained. In addition, a lattice mismatch problem exists which puts reliability into question. The polar phonon problem and the lack of a complementary HOLE device are also found in the GaAs/GaInAs device.

Germanium lies adjacent to and between the elements gallium and arsenic in the atomic table. The lattice constant of Ge is within a fraction of 1% of that of GaAs. By adding 1% indium to GaAs, Ge can be perfectly lattice-matched to the indium doped GaAs.

The HOLE mobility in germanium at room temperature exceeds that of the electron mobility of silicon at room temperature, and at cryogenic temperatures approaches 100,000. The ELECTRON mobility of germanium at room temperature significantly exceeds that of silicon, and at cryogenic temperatures approaches 1,000,000. Charge carriers (electrons and holes) of germanium do not "freeze out" at very low temperatures as they do in silicon or gallium arsenide.

Germanium is now the purest of all semiconductors. Refined over the past five years for ultra violet detector work, Ge can now be routinely obtained with total background impurity concentrations of $1 \times 10^{10}/cm^3$ as compared to $1 \times 10^{12}/cm^3$ in silicon and $5 \times 10^{13}/cm^3$ in GaAs.

In the mid 1970's research in silicon solid state epitaxy led to better processing of ion-implanted silicon devices and better MOS structures. However, prior to the concentration on silicon solid state epitaxy it was demonstrated that solid state epitaxy in germanium at low temperatures can be accomplished. It has recently been reported that germanium can be grown which exhibits low temperature electron mobilities approaching 1,000,000 and hole mobilities approaching 100,000. Not only are the germanium mobilities high, but the saturated velocity is also very high.

Additionally, research recently has shown that materials can now be deposited in high quality on a substrate at low temperature by using a shielded plasma source to "pyrolize" the reactant-bearing gas(es) thus permitting the substrate temperature to be independently controlled without consideration for the substrate being kept at a temperature high enough to pyrolize the reactant-bearing gas. The substrate can thus be kept at a much lower temperature without adversely effecting the deposited film morphology or structure. Thus, interdiffusion between the substrate and the deposited film becomes negligible. Additionally, recently reported work uses ion cluster beam technology to deposit GaAs onto Ge at low temperature without interdiffusion and resulting autodoping.

In the mid 1960's silicon won a decisive competition with germanium. At that time there were two uncontested attributes of silicon which set the course of materials development for the next two decades. The first was that silicon had a native insulator and germanium did not. The second was that silicon had a higher bandgap than germanium and if high operation temperature is encountered, the larger bandgap is favored. In 1983 several changes have happened which re-open the competition. First among these was the announcement that insulators could be subcutaneously grown in germanium by ion implantation. By significantly reducing the oxygen content of reactant ammonia gases, the native germanium nitride insulator has been demonstrated to reproducibly ensure the inversion of the germanium surface. Shielded plasma depositions of $SiO_2/Si_3N_4$ composite insulating layers have also been reproducibly shown to affect inversion in a stable manner. The germanium equivalent of the CMOS technology thus becomes viable.

The highest speed silicon logic being considered today is that of cooled CMOS. In contrast to silicon where cooling by liquid nitrogen has small but significant advantages, cooling germanium creates very large improvements in both hole and electron mobility and in saturated carrier velocities. Whereas charge carriers in silicon begin to freeze out at lower temperatures, there is no measurable freeze out of charge carriers in germanium at temperatures as low as those needed for superconducting metallization.

Heteroepitaxial growth of germanium on gallium arsenide and vice versa has been demonstrated by several investigators and is well-known. Successful growth is most commonly achieved by the molecular beam epitaxy (MBE) process in a high vacuum and at temperatures exceeding 580° C. Unfortunately, arsenic from the underlying GaAs diffuses into the growing germanium film causing the germanium to contain large concentrations of arsenic and measurable concentrations of arsenic to a depth of 2μm into the germanium. Obviously this is not suitable for use as a HEMT structure.

A process known as solid phase epitaxy was developed during the mid 1970's. Virtually all demonstrations were with silicon although GaAs was also shown to be amenable to the process. Simply stated, amorphous (not polycrystalline) silicon is deposited onto a single crystalline silicon substrate. The substrate and amorphous film are then both heated to 550° C. or higher and the amorphous layer regrows epitaxially into a single crystal film. Although the technology has not been extensively used, the work conclusively demonstrated that elemental semiconductors could be changed from their amorphous state to a single crystalline state. More importantly however, the temperature at which the epitaxial growth occurs can be substantially lower (hundreds of degrees) than that required for conventional epitaxial growth.

During the past years much knowledge has been gained regarding plasma-assisted deposition of films. Pertinent aspects of these advances can be summarized as follows: (1) charged ions must be avoided at the growth surface, (2) the growing surface must not be in the line-of-sight to the plasma flow, (3) path length must be sufficiently short so as to prevent molecular recombination of reactant ions and (4) flow rate must be accurately controllable.

The mobility of charges in a semiconductor is expressed by $e\tau/m$. For germanium m is three times larger than for GaAs. The purity of undoped germanium is, however, as much as 5000 times better than that of the best of GaAs. Thus the scattering time $\tau$ of undoped germanium is conservatively 100 times longer than that in GaAs. The effective mobility in a two dimensional electron gas state can thus be much higher than it is in GaAs. Since there is no polar scattering in germanium as there is in GaAs, the charge carriers (e.g., electrons or holes) can theoretically gain much more energy (speed) than is possible in GaAs. Thus the saturated velocity will be considerably higher. Since donors do not go as deep (energy-wise) in GaAs as they do in GaAlAs, the GaAs can be used as the supplier of electrons for the two dimensional electron gas in germanium. Thus, the realizable heterojunction offset is much greater in the GaAs/Ge interface than it is in the GaAlAs/GaAs interface. Since there is no polar scattering in germanium, the performance of a GaAs/Ge HEMT would be considerably greater than that of a GaAlAs/GaAs HEMT device.

In addition to the superior HEMT technology created by the GaAs/Ge interface, a High Hole Mobility Transistor (HHMT) is also possible as the holes in Ge are considerably lighter than are holes in GaAs. In semiconductors which holes are derived from ionized acceptor impurities, the hole mobility of germanium is typicallly 6 to 7 times that of GaAs. In a two dimensional hole gas device it would be even higher.

The use of the GaAs/Ge interface thus offers the potential of creating a complementary p-channel/n-channel logic technology whose operating speed cannot be matched by any other semiconductor technology. Switching speeds of less that 5 picoseconds with power-delay products of 250 attojoules can be projected.

Since the charge carriers in this HMT technology do not freeze out as the temperature is lowered, operation can also be envisioned at temperatures wherein superconducting transmission lines are possible thereby eliminating dispersion and cross-talk problems encountered by conventional dense semiconductor technology. Thus 3-terminal logic devices may be used at speeds and power dissipation nearly equal to that projected for Josephson junction technology.

Metallization losses can be substantially reduced by cooling to a temperature of 40° K. At this temperature more conventional semiconductors experience carrier freezeout and can not exploit the substantially increased conductivity of aluminum whereas GaAs/Ge technology can effectively exploit this temperature where closed cycle cryocoolers are efficient.

Accordingly, it is desirable to provide high mobility transistors using germanium/gallium arsenide for providing complementary logic field effect transistors.

Accordingly, it is an object of the present invention to provide germanium/gallium arsenide complementary logic field effect transistors which can operate at ultra high mobilities and do not deteriorate at low temperatures and a method for making said transistors.

Another object of the present invention is to provide germanium/gallium arsenide complementary logic field effect transistors wherein the construction of the field effect transistor is accomplished wherein the germanium and gallium arsenide do not impurity dope each other or out-diffuse into the other material.

Further objects and advantages of the present invention will become apparent as the following description proceeds and features of novelty characterizing the invention will be pointed out with particularity in the claims annexed to and forming a part of this specification.

SUMMARY OF THE INVENTION

Briefly, the present invention relates to complementary logic field effect transistors having high electron and hole mobility and are able to maintain transistor action at cryogenic temperatures. In one embodiment of the present invention, germanium material is deposited upon a gallium arsenide substrate and high hole concentration areas and high electron concentration areas are created in the germanium layer. In another embodiment a germanium substrate is provided and a gallium arsenide layer is grown upon the germanium substrate with appropriate high hole concentration areas and high electron concentration areas being created within the gallium arsenide.

DESCRIPTION OF THE DRAWINGS

For a better understanding of the present invention reference may be had to the accompanying drawings wherein.

DETAILED DESCRIPTION OF THE PREFERRED EMBODIMENT

Figure 1:
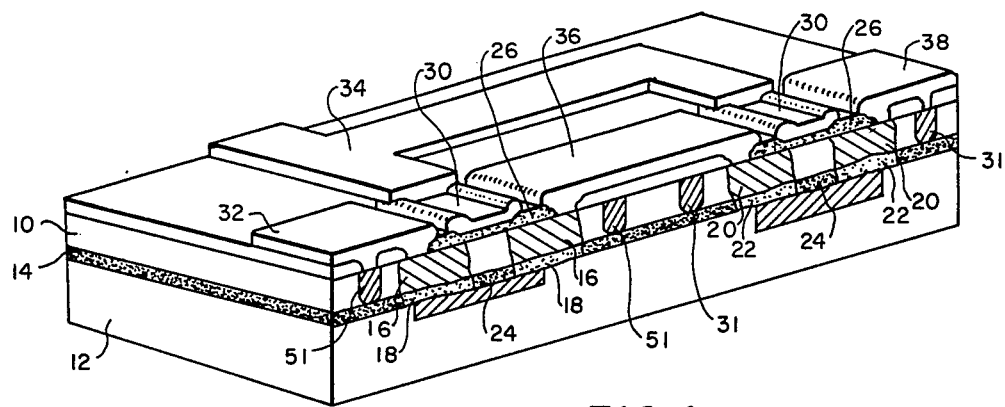
FIG. 1 is a representation in cross-section of one embodiment of the present invention having a gallium arsenide substrate and an upper layer of germanium.
Figure 2:
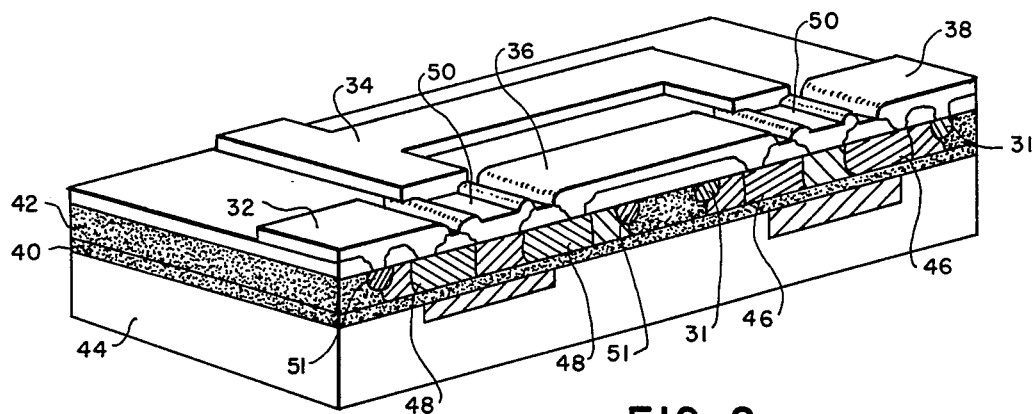
FIG. 2 is a representation in cross-section of another embodiment of the present invention wherein there is provided a germanium substrate and an upper layer of gallium arsenide.
Figure 3:
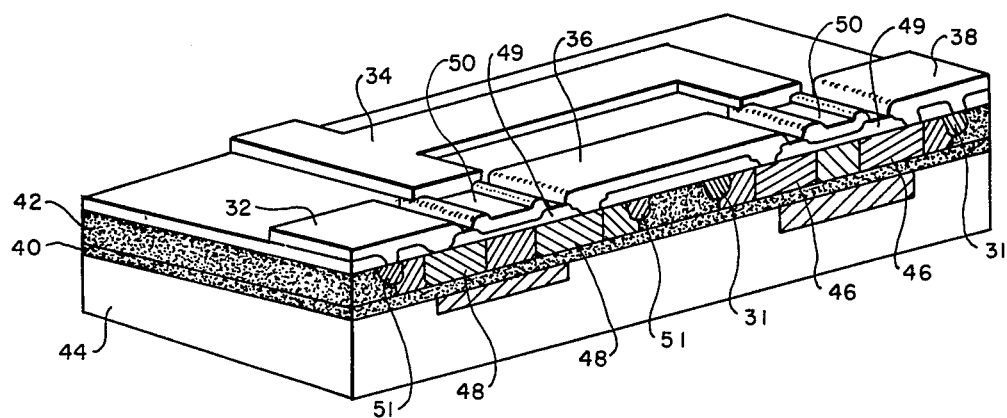
FIG. 3 is another representation of the present invention wherein the embodiment of FIG. 2 is provided with an insulating layer underneath the gate control contacts.

Two embodiments of high mobility transistors are presented. One embodiment uses germanium on top of gallium arsenide while the other embodiment uses gallium arsenide on top of germanium. In each of these versions there is both a p-channel and a n-channel version and these are produced in a device composed of a complementary pair, i.e., p-channel and n-channel connected together, as the basis of a logic cell. FIG. 1 shows the germanium on top of gallium arsenide version while FIGS. 2 and 3 show the gallium arsenide on top of germanium.

An important aspect in implementing the embodiment of FIG. 1 is to deposit germanium on top of gallium arsenide in such a manner that the germanium does not diffuse into the gallium arsenide and thereby impurity dope the gallium arsenide or vise versa such that the gallium and/or arsenic does not outdiffuse into the germanium and impurity dope the germanium. Two methods, among others, will accomplish this. The first such method is to deposit an undoped amorphous germanium layer 10 onto an undoped gallium arsenide substrate and buffer 12 having a top layer 14 of undoped GaAs epitaxial material 30–60 Å thick grown preferably by molecular beam epitaxy, chemical vapor deposition, or atomic layer epitaxy. The deposit of layer 10 is accomplished at a low temperature and then the temperature is increased not to exceed 300° C. whereupon the germanium recrystallizes by a process of solid phase epitaxy. The second method is to deposit the germanium layer 10 onto layers 12 and 14 using an ion cluster beam process wherein the gallium arsenide substrates 12, 14 are kept at a temperature under 300° C. such that interdiffusion is precluded. A third method would use a remote shielded plasma source for the germanium monomers.

Germanium ions and gallium ions are implanted in their respectively similar layers 14 and 10 at 18 and 16 of FIG. 1 so as to create regions of high hole concentration. Germanium ions and arsenic ions are then correspondingly implanted in layers 14 and 10 at 22 and 20 so as to create a region of high electron concentration. Activation/anneal is then performed for approximately ten seconds at 900° C. being preferred for activation. In one variation of this embodiment, protons can be implanted in region 24 so as to render the gallium arsenide of that portion of layer 14 non-conducting. A subsequent solid phase epitaxial growth at temperatures less that 300° C. recrystallizes the germanium, but leaves the underlaying GaAs semi-insulating in the region 24 immediately beneath the channel. Thus carriers can be injected from the end regions.

The region 26 is a deposited insulator immediately beneath the control gates 30. A remote shielded plasma chamber is used to deposit $SiO_2$ and/or $Si_3N_4$ free of Si—H bonds. Guard rings 31 and 51 are optional. In manners known in the art, ohmic contact metalizations for a ground contact 32, gate input 34, output contact 36 and supply voltage 38 are deposited on the surface.

FIG. 2 shows the gallium arsenide layers 40, 42 deposited on top of high resistivity germanium substrate 44. The gallium arsenide 40, 42 is best put down by ion cluster beam technology at a temperature less than 300° C. so as to preclude interdiffusion. An alternative approach uses a remote shielded plasma source of arsine (as a source of arsenic monomers in conjunction with a metal-organic source of gallium in a low pressure chemical vapor deposition mode at a substrate temperature of 320° C. The 30–60 Å region 40 is not purposefully doped. The overlying region 42 is nominally 350 Å for a normally "off" device and 500 Å for a normally "on" device when the doping concentration is $1 \times 10^{17}/cm^3$. The p+GaAs regions 46 and the n+GaAs regions 48 are best obtained by ion implantation and are activated by rapid thermal annealing (900° C. for 10 seconds) so as to preclude appreciable germanium/gallium arsenide interdiffusion. In FIG. 3, an overlay gate insulator layer 49 is deposited by remote shielded plasma techniques, however the layer 49 is not used in the embodiment of FIG. 2. The germanium channel material is semi-insulating in nature and thus can block any channel current except when the control gates activate the channel. The control gates 50 can be Schottky barrier metal gates, p−n/n−p junctions or insulated gates.

A simplication of the FIG. 3 complementary device (not shown) is one in which the gallium arsenide overlayers are eliminated altogether. The p+ and the n+ ohmic contacts are directly implanted into the underlying high purity germanium thereby forming n—i—n and p—i—p complementary devices. This complementary device pair differs from a conventional n—MOS/p—MOS complementary pair in that it relies on high purity germanium material with a total impurity concentration of less than $1 \times 10^{-10}/cm^3$ for channel isolation and device turn off. Operation must be at temperatures below 213° K. This is semi-insulating in nature and thus blocks any channel current except when the control gates activate the channel. Although this device is much simplier than that of one with the overlying gallium arsenide, it may suffer from reduced performance at temperatures approaching absolute zero whereas the embodiment having the overlying GaAs operates well near absolute zero.

This germanium only device pair must use an insulated gate structure as shown in FIG. 3 as a Schottky barrier would be too low (energy-wise) to operate properly. This control gate structure is best made by depositing by shielded remote plasma deposition methods a 100 Å silicon dioxide film followed by a 600 Å silicon nitride film. Deposition temperature can be as low as 230° C. and requires no subsequent annealing. The gate metal is subsequently deposited over the composite insulator. The germanium-only complementary HMT has an advantage in that source channel resistance i.e., that resistance in the electron channel between the source and the gate normally found in GaAs/GaAlAs HEMT structures, is eliminated.

Figure 4:
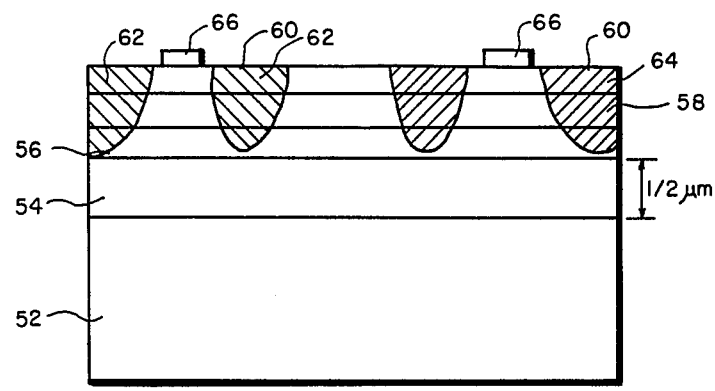
FIG. 4 shows a representation, in cross section, on an enlarged scale, of a refinement of the structures of FIGS. 1-3.

A further refinement of the structures of FIGS. 1-3 is shown in cross-section in FIG. 4. On a semi-insulating gallium arsenide substrate 52 is grown one-half micron of undoped gallium arsenide layer 54 having one percent indium doped for better lattice matching to a subsequent germanium layer. On top of the half micron layer of gallium arsenide 54 is grown a 250 Å layer 56 of one percent indium plus gallium arsenide doped at a level of $1 \times 10^{18}/cm^3$ silicon impurity doping. On top of layer 56 is grown 300 Å of undoped germanium layer 58 at about 200° C. and subsequently recrystallized at 230° C. On top of the germanium layer 58 is grown an insulating film of germanium nitride or Si—H free SiO$_2$, 200–400 Å thick, depending on the pinch-off voltage desired. Finally, ohmic source and drain contacts 60 are applied to the germanium by using arsenic doping 62 for the n-channel, and aluminum doping 64 for the p-channel. These easily formed ohmic contacts are of great benefit to the device, and represent a considerable advantage over unreliable contacts available in competing technology of other semiconductors. Gate metal contacts 66 typically made of Al are then deposited.

Thus there are disclosed germanium/gallium arsenide complementary logic field effect transistors having high carrier mobility and wherein mobility is not appreciably decreased even at cryogenic temperatures. The transistors are produced on germanium or gallium arsenide substrates having both n-type and p-type field effect transistors connected in series for complementary logic functions.

While there has been illustrated and described what is at present considered to be a preferred embodiment of the present invention, it will be appreciated that numerous changes and modifications are likely to occur to those skilled in the art and it is intended in the appended claims to cover all those changes and modifications which fall within the true spirit and scope of the present invention.

What is claimed as new and desired to be secured by Letters Patent of the United States is:

1. A method of producing a germanium-gallium arsenide complementary logic transistor comprising the steps of:
   providing an undoped gallium arsenide substrate,
   growing a first layer of undoped GaAs epitaxial material on the substrate at a temperature less than 300° C.,
   depositing a second layer of undoped amorphous germanium on the first layer at a temperature less than 320° C.,
   heating the device to a temperature not to exceed 300° C. for crystalizing the germanium by solid phase epitaxy,
   implanting germanium ions and gallium ions into respective first regions of the first and second layers to create regions of high hole concentration,
   implanting germanium ions and arsenic ions respectively into second regions of the first and second layers to create regions of high electron concentration,
   rapid thermal annealing of the device,
   depositing an insulating layer onto appropriate portions of the device, and
   depositing metalization contacts over appropriate regions for providing control gates.

2. A method of producing a germanium-gallium arsenide complementary logic transistor comprising the steps of:
   providing an undoped gallium arsenide substrate,
   growing a first layer of undoped GaAs epitaxial material on the substrate at a temperature less than 320° C.,
   depositing a second layer of germanium by ion cluster beam processes at a temperature less than 300° C.,
   implanting germanium ions and gallium ions into respective first regions of the second and first layers to create regions of high hole concentration,
   implanting germanium ions and arsenic ions respectively into the second regions of the first and second layers to create regions of high electron concentration,
   rapid thermal annealing of the device,
   depositing an insulating layer into appropriate portions of the device, and
   depositing metalization contacts over appropriate regions for providing control gates.

3. A method of producing a germanium-gallium arsenide complementary logic transistor comprising the steps of:
   providing an undoped gallium arsenide substrate,
   growing a first layer of undoped GaAs epitaxial material on the substrate,
   depositing a second layer of undoped amorphous germanium onto the layer of undoped GaAs,
   implanting protons into portions of the first layer for rendering first portions of the first layer non-conducting,
   increasing the heat of the device to a temperature not to exceed 300° C. for crystalizing the germanium by solid phase epitaxy,
   implanting germanium ions and gallium ions respectively into first regions of the second and first layers proximate the non-conducting first portion to create regions of high hole concentration, implanting germanium ions and arsenic ions respectively into second regions of the first and second layers proximate other non-conducting first portions to create regions of high electron concentration, rapid thermal annealing of the device, depositing an insulating layer onto appropriate portions of the device, and depositing metalization contacts over appropriate regions for providing control gates.

4. A method of producing a germanium-gallium arsenide complementary logic transistor comprising the steps of:

providing a high resistivity germanium substrate, depositing a first layer of GaAs onto the substrate at a temperature less than 320° C., depositing a second layer of doped GaAs onto the first layer at a temperature less than 320° C., creating first regions of p+GaAs and n+GaAs in the second layer by ion implantation and subsequent rapid thermal annealing, depositing an insulating layer disposed over appropriate portions of the first regions, and depositing metalization contacts over appropriate regions for providing control gates.

5. A method of producing a germanium-gallium arsenide complementary logic transistor comprising the steps of:

providing a high resistivity germanium substrate, depositing a first layer of GaAs onto the substrate at a temperature less than 320° C., depositing a second layer of doped GaAs onto the first layer at a temperature of less than 320° C., creating first regions of p+GaAs and n+GaAs in the second layer by ion implantation and subsequent rapid thermal annealing, and depositing metalization contacts over appropriate regions for providing control gates.

6. A method of producing a germanium-gallium arsenide transistor comprising the steps of:

providing a semi-insulating gallium arsenide substrate, growing a first layer of undoped gallium arsenide having a first predetermined level of indium, growing a second layer of gallium arsenide having a second predetermined level of indium and a predetermined level of silicon impurities, growing a third layer of undoped germanium at approximately 200° C. onto the second layer and solid phase epitaxially regrowing same, growing an insulating film of one of germanium nitride and Si—H free $SiO_2$, and depositing metalization contacts over appropriate regions of the insulating layer for providing control gates.

* * * * *